(12) United States Patent
Reddi

(10) Patent No.: US 6,366,099 B1
(45) Date of Patent: Apr. 2, 2002

(54) DIFFERENTIAL CAPACITANCE SAMPLER

(75) Inventor: M. Mahadeva Reddi, Bryn Mawr, PA (US)

(73) Assignee: Conrad Technologies, Inc., Paoli, PA (US)

(*) Notice: Subject to any disclaimer, the term of this patent is extended or adjusted under 35 U.S.C. 154(b) by 0 days.

(21) Appl. No.: 09/468,139

(22) Filed: Dec. 21, 1999

(51) Int. Cl.[7] .............................. G01R 27/26
(52) U.S. Cl. ................. 324/678; 324/658; 324/686
(58) Field of Search .................... 324/678, 658, 324/660, 725, 706, 686

(56) References Cited

U.S. PATENT DOCUMENTS

| | | |
|---|---|---|
| 4,093,915 A | 6/1978 | Briefer |
| 4,193,063 A | 3/1980 | Hitt et al. |
| 4,287,471 A | 9/1981 | Ko et al. |
| 4,387,601 A | 6/1983 | Azegami |
| 4,391,146 A | 7/1983 | Grindheim |
| 4,509,007 A | 4/1985 | Barsotti et al. |
| 4,705,127 A | 11/1987 | Kunz |
| 4,896,098 A | 1/1990 | Haritonidis et al. |
| 5,048,165 A * | 9/1991 | Caldwell ................. 29/25.41 |
| 5,092,171 A | 3/1992 | Wallrafen |
| 5,311,140 A | 5/1994 | Permuy |
| 5,325,065 A | 6/1994 | Bennett et al. |
| 5,424,650 A * | 6/1995 | Frick ......................... 324/688 |
| 5,495,414 A | 2/1996 | Spangler et al. |
| 5,511,420 A | 4/1996 | Zhao et al. |
| 5,594,353 A * | 1/1997 | Hemphill ................ 324/681 |
| 5,629,629 A * | 5/1997 | Tielert et al. ............ 324/679 |
| 5,635,739 A | 6/1997 | Grieff et al. |
| 5,659,195 A | 8/1997 | Kaiser et al. |
| 5,682,788 A | 11/1997 | Netzer |
| 5,730,165 A | 3/1998 | Philipp |
| 5,801,313 A * | 9/1998 | Horibata et al. ........... 73/718 |
| 5,847,280 A | 12/1998 | Sherman et al. |
| 6,151,967 A * | 11/2000 | McIntosh et al. ....... 73/514.32 |

OTHER PUBLICATIONS

Larry K. Baxter; "Capacitive Sensors"; IEEE Press, 1997, pp. 55–64.

Don Lancaster; "CMOS Cookbook"; Newnes, 1997, pp. 269–274.

\* cited by examiner

Primary Examiner—Safet Metjahic
Assistant Examiner—T. R. Sundaram
(74) Attorney, Agent, or Firm—Ratner & Prestia

(57) ABSTRACT

Differential capacitance is sensed by charging two capacitors to a voltage equal in magnitude but opposite in polarity during a short sampling period and discharging them in parallel during the remaining longer period of a pulse repetition cycle. In the preferred embodiment, an operational amplifier converts the charge difference to a voltage output signal. In an embodiment suitable for transducers, high sensitivity and low noise performance is obtained because of the output signal provided by the sensor is directly proportional to the excitation voltage, the excitation frequency and the value of a feedback resistor. This embodiment is also useful for proximity sensing in the presence of moisture and other ionic conductors, because the charging pulse can be of a short duration, typically 100 ns or less. An alternate embodiment, having a sensitivity that is independent of excitation frequency, provides a voltage output signal that is linearly related to the displacement of the central plate of a three-plate capacitor.

15 Claims, 6 Drawing Sheets

DIFFERENTIAL CAPACITANCE SAMPLER

The United States Government may have limited rights in this invention pursuant to SBIR funding under Contract No. N62269-96-C-0065.

BACKGROUND OF THE INVENTION

1. Field of the Invention

The present invention relates to capacitance measuring circuits and in particular to a capacitance measuring circuit that produces an electrical output signal proportional to capacitance changes and to a capacitive field sensor that detects a field disturbance in an emitted field.

2. Description of Prior Art

Capacitance measuring circuits are used in many types of transducers in which a change in capacitance results from a change in the gap or variation in the area of the capacitor plates or a change in the size and/or properties of the dielectric between the plates. Some exemplary types of transducers include weight scales, thickness gauges, liquid level sensors, linear and rotary position sensors, accelerometers, and pressure transducers.

The prior art is replete with circuit arrangements for measuring an unknown capacitance. While an unknown capacitance $C_1$ may be measured directly, improved sensitivity is usually obtained by comparing it to a second capacitance, $C_2$. Such methods for producing a differential signal have been extensively used in prior art. As described in a book, "Capacitive Sensors" by Larry K. Baxter, IEEE Press, 1997, the differential methods produce an output signal which is quantified by either $V(C_1-C_2)/(C_1+C_2)$, $V(C_1-C_2)/C_f$, or $VC_1/C_2$, where V is an excitation voltage and $C_f$ is a circuit feedback capacitance. Generally these methods employ an amplification stage, followed by a detection stage that translates an AC signal produced by a capacitor bridge into a DC signal related to the unknown capacitance. This DC signal is typically amplified further to produce a useful signal level.

If this multiplicity of stages is eliminated such that a first stage produces an adequate DC signal level, noise performance can be greatly improved. Because the output signal of the first stage determines not only the sensitivity, but also the noise performance of the overall system, it is important for this signal to have its largest possible value. Moreover, as $C_1$ and $C_2$ increase in magnitude while at the same time the quantity $(C_1-C_2)$ decreases in an application, an adequate first stage response becomes more and more desirable. Obviously one way to increase the amplitude of the output signal of the first stage is to increase the excitation voltage V. There are, however, practical limits to how much the excitation voltage can be increased because of considerations arising from other circuit components, including the power supply. Similarly, the magnitude of the value $V(C_1-C_2)/C_f$ can be increased by decreasing $C_f$, but circuit stability considerations again limit the extent to which it can be reduced.

Three plate differential capacitors, comprising two fixed and one central movable plate, are frequently used in transducers. Since the quantity $V(C_1-C_2)/(C_1+C_2)$ is directly proportional to the displacement of the central plate, circuits based on measuring this displacement are particularly popular for use in accelerometers and pressure sensors. Many such circuits, however, are configured such that the movable plate is electrically active, necessitating electrical isolation from its mechanical support. Also, to improve performance, an electrically active shield is often used to guard the movable plate. These circuit requirements increase the mechanical complexity of three plate systems. Moreover, when capacitance is large and the capacitance change to be measured is small, the magnitude of $V(C_1-C_2)/(C_1+C_2)$ tends to be small because of the large denominator. In addition, any stray capacitance that may be present becomes an additive term in the denominator, leading to a further reduction in first stage response.

In U.S. Pat. No. 4,193,063, Hitt and Mergner disclose a circuit for producing an output signal that is linearly related to the displacement of the grounded central plate of a differential capacitor. The capacitors are charged in parallel from a constant current source for a fixed period of time and discharged through separate circuits for another period of time. As the capacitors discharge, an integrating differential amplifier produces an output signal related to the difference in area between the two discharge curves. This circuit uses an amplifier with high common mode rejection and also uses a charge period that is sufficiently long to inject detectable levels of charge.

In U.S. Pat. No. 4,287,471 Ko and Hung disclose a circuit wherein differential capacitors are energized by a square wave signal. The variation in capacitance is then detected by a diode bridge and amplified to produce an output signal indicative of the centering of a grounded metal strip. This circuit also uses an amplifier with high common mode rejection and, in addition, the excitation signal has a symmetrical waveform.

In U.S. Pat. No. 4,896,098 Haritonidis et al. disclose a circuit in which the central plate of a differential capacitor is driven by an AC generator. A capacitive voltage divider is formed with each of the stationary plates by means of two additional capacitors connected to ground. The output signal of each voltage divider drives a respective field effect transistor supplying current to the input terminal of a respective amplifier. The output signals from these two amplifiers are provided to a differential amplifier to produce a signal indicative of capacitance change. This circuit also uses an amplifier with high common mode rejection and a symmetrical excitation waveform.

Capacitance measuring circuits are used in a variety of applications, including proximity sensors, lamp dimmers, limit switches, and touch screens. All of these devices function by detecting capacitance changes caused by objects entering an emitted electrical field. While two plate capacitors can be used for this purpose, one plate circuits yield better detection range in distance. Typically, the capacitor for these applications comprises a single plate connected to a suitable circuit to emit a periodic electrical field that propagates out into space, the second plate of the capacitor being made up by the first plate's environment of nearby objects and ground. When the position or the dielectric properties of proximate objects change, the capacitance measured at the first plate undergoes change. To detect this change, prior art includes methods based on sensing imbalance in capacitance bridges, shift in resonance frequency of tuned circuits, and timing changes in resistor capacitor (RC) circuits. Common shortcomings of these circuits include insensitivity to small changes in large capacitance and spurious response to the presence of moisture near the sensing plate. Additionally, when several sensors are used near each other, their performance may be degraded by cross talk among adjacent electric fields. Moreover, the continuous wave excitation used in the prior art has the potential for radio frequency interference.

To overcome some of these shortcomings, the prior art includes some proximity sensors that are claimed to function in the presence of moisture or other weakly conducting liquid media. Among these, are those which infer the value of an unknown capacitance utilizing short duration charge and/or discharge pulses.

One transducer of this type is disclosed in U.S. Pat. No. 5,730,165. This patent concerns a circuit for charging a sensing electrode and a switching element acting to remove that charge and transfer it to a charge detection circuit. The time duration of the charge and discharge steps can vary widely, with at least one of the steps being of a shorter duration than a characteristic conduction time for water. The teachings disclose that as the charge and/or discharge duration is decreased, apparent capacitance due to moisture also decreases. A duration of 100 nsec. or less is suggested as being optimal, for example, when detecting a human hand in the presence of water. The sensitivity of the disclosed circuit, however, depends on how many charge/discharge pulses are used while accumulating the charge transferred to the charge detector. As a result, gain of the circuit is severely bandwidth limited. Also, because the circuit is single ended, it does not provide the benefits that a differential configuration would.

Still other applications of capacitance measuring circuits include sensors for moisture content of wood, or ripeness of fruit, based on detecting capacitance changes due to variation of dielectric properties. These sensors are generally intended for the wide-ranging consumer markets and hence, are extremely price sensitive. The complexity of circuits disclosed in prior art, with requirements for high parts count and cost, makes them unattractive for these applications.

SUMMARY OF THE INVENTION

The present invention is embodied in a capacitance sampler having sensitivity that is directly proportional to sampling frequency and to differential capacitance, regardless of the size of each capacitance. This sensor has improved noise performance when compared to prior art capacitance sensors. The principle underlying the invention is that when two capacitors charged to voltages equal in magnitude but opposite in polarity are connected in parallel, they become discharged and any residual charge is a direct measure of the difference in their capacitance. The invention employs repetitive charge/discharge cycles, depending on the application. During each cycle, capacitance is sampled by fully charging the capacitors during a portion of the charge/discharge cycle, and discharging the capacitors during the remaining portion of the cycle. The residual charge can be measured either in a current mode or a voltage mode. Because this charge is acquired from the charging pulse, differential capacitance is sampled during the duration of the charging pulse.

One exemplary embodiment of the invention comprises a pulse generator which produces low duty cycle, complementary charging pulses. A capacitance sampler samples a differential capacitance to provide a signal to an output device operated in a current mode. The capacitance sampler includes an RC bridge, comprising at least one capacitor in one branch and at least one resistor in the other branch. Each resistor, capacitor junction of the bridge is connected to the pulse generator through a switching diode, such that each diode conducts current through the bridge during a short charging period and isolates the bridge from the pulse generator during a longer discharge period of the pulse repetition interval. The capacitor side of the bridge circuit is connected to a voltage reference, usually ground. The resistor side of the bridge is connected to an amplifier that is configured to measure the residual charge on the capacitor side of the bridge. In the preferred current mode embodiment, a current to voltage converter drains the residual charge at this junction and provides a voltage output signal given substantially by the quantity $Vf(C_1-C_2)R$, where V is an excitation voltage, f is a drive frequency, R is the resistance of a feedback resistor, and $(C_1-C_2)$ is the unknown differential capacitance. To attenuate artifacts from bridge excitation, an optional low pass filter may be used to filter the output signal. In one embodiment of the invention, a single amplifier produces an output signal proportional to differential capacitance. Consequently, noise performance is greatly enhanced over the prior art capacitance measuring devices.

DETAILED DESCRIPTION

It is worth noting that $(C_1-C_2)$ for a three-plate differential capacitor is linearly related to central plate displacements ranging up to 20% of the gap that is present when the movable plate is centered. As detailed on pages 63 and 64 of the book by Baxter, the nonlinearity is less than 1% for a plate displacement of 20% of gap, decreasing to 0% when the plate is centered. In many applications, because the maximum center plate displacement is only a few percent of the gap, measuring the quantity $(C_1-C_2)$ is an attractive alternative to measuring $V(C_1-C_2)/(C_1+C_2)$, particularly if it results in increased sensitivity and simpler mechanical construction.

Figure 1A:
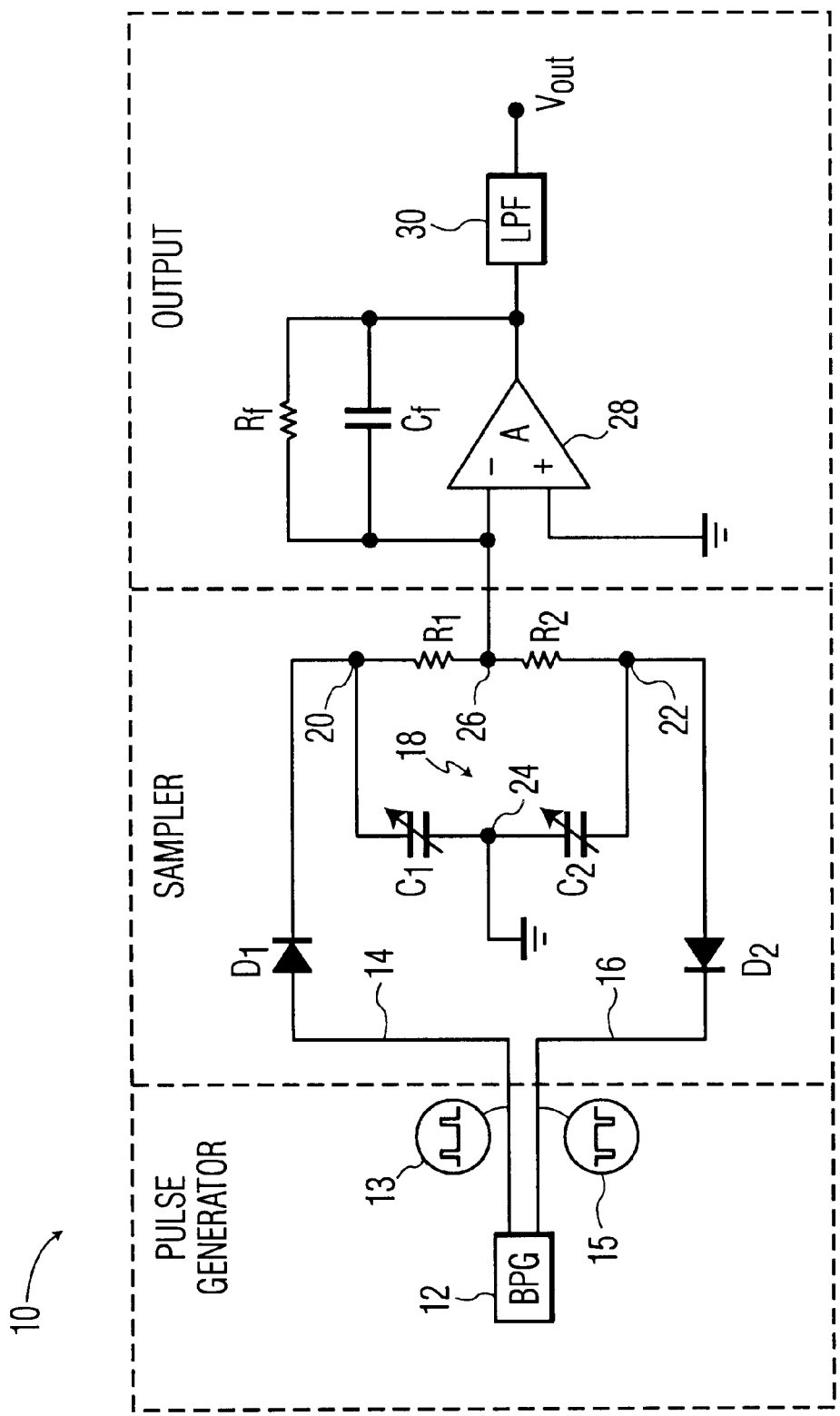
FIG. 1a is a schematic drawing of a differential capacitance sampler operating in a current mode.

Four basic differential capacitance samplers are illustrated in FIGS. 1a–d. FIG. 1a depicts a sensor 10 operating in a current mode. A balanced pulse generator 12 provides complementary, low duty cycle square wave excitation pulses to drive the sensor. A balanced pulse generator provides pulses which are substantially equal in magnitude although opposite in polarity. Several low-duty cycle square wave oscillators are described in a book by D. Lancaster entitled *CMOS Cookbook*, Newnes, 1997, pp 269–274. Pulse repetition frequencies of 100 KHz to 1 MHz with a duty cycle of 10% or less are typical for circuits of this type. It is contemplated, however, that other waveforms, defining other charge/discharge cycles may be used. A key factor in the relative length of the charge and discharge portions of the cycle is that the charge portion is desirably sufficiently long to provide at least a measurable amount of charge on the capacitors and the discharge portion is desirably sufficiently long to allow the capacitors to reach a substantially discharged state. In the exemplary embodiments of the invention, the charge portion of the charge/discharge cycle is 50% or less of the total cycle time. It is contemplated, however, that the charge portion may be greater than the discharge portion.

The output signals of the balanced pulse generator 12 are typically a positive pulse train as shown by inset 13 on conductor 14 and a negative pulse train as shown by inset 15 on conductor 16. Conductor 14 connects the positive pulse train output signal of pulse generator 12 to the anode of a first diode $D_1$. The cathode of $D_1$ is connected to node 20. Similarly, conductor 16 connects the negative pulse train output signal from pulse generator 12 to the cathode of a second diode $D_2$. The anode of $D_2$ is connected to node 22.

The pulses from the generator 12 are applied to a differential capacitance sampling bridge 18 formed between four nodes 20, 22, 24 and 26. A first capacitor $C_1$ is connected between nodes 20 and 24 and a second capacitor $C_2$ is connected between nodes 22 and 24. Node 24 is connected to a source of reference potential (e.g. ground). Either or both $C_1$ and $C_2$ may vary in capacitance. A first resistor $R_1$ is connected between nodes 20 and 26. A second resistor $R_2$ is connected between nodes 22 and 26. Node 26 is connected to the negative input terminal of an amplifier (A) 28. The output terminal of the amplifier (A) 28 is connected to its negative input terminal through a parallel combination of resistor $R_f$ and capacitor $C_f$. The positive input terminal of the amplifier (A) 28 is also connected to ground. (As is well known to those familiar with the art, for bipolar power supply operation, ground reference for operational amplifiers is usually a voltage potential equal to zero, whereas for a unipolar power supply, it is usually one half the power supply voltage, but can be set to a different value to suit unrelated design requirements.) An optional low-pass filter 30 is connected to the output terminal of the amplifier (A) 28 to filter any remaining artifacts of the excitation.

Hereinafter, the positive pulse train is said to be high if the voltage is at its maximum value during the short charging period of the pulse repetition cycle and is said to be low, otherwise. Conversely, the negative pulse train is said to be low if the voltage is at or near its minimum value during the short charging period of the pulse repetition cycle and is said to be high otherwise.

In operation, when a pulse of the positive pulse train is high, the corresponding pulse of the negative pulse train is low, and switching diodes $D_1$ and $D_2$ become forward biased. Current flows through the two resistors $R_1$ and $R_2$ and capacitors $C_1$ and $C_2$ whereby the two capacitors are fully charged to voltages $(V-V_d)$ and $-(V-V_d)$, where $V_d$ is the voltage drop across a forward-biased diode (e.g. approximately 0.7 V for a silicon diode and 0.2 V for a germanium diode). When the positive pulse train returns to low, the negative pulse train goes high and the switching diodes $D_1$ and $D_2$ become reverse biased isolating the differential capacitance bridge 18 from pulse generator 12. Capacitors $C_1$ and $C_2$ then discharge through the resistors $R_1$ and $R_2$ toward ground reference. If the two resistors $R_1$ and $R_2$ are of equal magnitude and if $C_1$ and $C_2$ are also equal in magnitude, then the discharge takes place along exponential curves that are mirrored about ground reference potential. Consequently, the negative input terminal of the operational amplifier (A) 28 remains at ground reference during the discharge cycle and the output signal from the operational amplifier also remains at ground reference potential. Capacitor $C_f$, in combination with resistor $R_f$, acts as a low pass filter for the output signal of amplifier (A) 28.

If, however, the two resistors $R_1$ and $R_2$ are of equal magnitude but the capacitors $C_1$ and $C_2$ are not equal in magnitude, then the exponential discharge curves are not mirrored about the ground reference potential and a non-zero voltage is presented to the negative input terminal of operational amplifier A. The amplifier (A) 28, in turn, develops an output voltage $V_{out}$ to maintain its negative input terminal at the same voltage as its positive input terminal, namely, ground reference. If the discharge times are sufficiently long to allow the capacitors to substantially completely discharge to ground reference potential, then the integrated voltage between the two discharge curves may be represented substantially by equation (1):

$$V_{out}=(V-V_d)(C_1-C_2)R_f f \qquad (1)$$

where f is the frequency of the pulse generator.

Unlike the transfer functions for capacitance sensors in prior art, this equation does not include, on the right hand side, a denominator containing $C_1$, or $C_2$, or both, which reduces the magnitude of $V_{out}$. Also, constant stray capacitance does not effect $V_{out}$. Moreover, unlike prior art embodiments in which the magnitude of the excitation voltage V is the only means to increase sensitivity, the present embodiment has additional means for achieving high sensitivity by suitably increasing the magnitudes of $R_f$ and f.

Figure 1B:
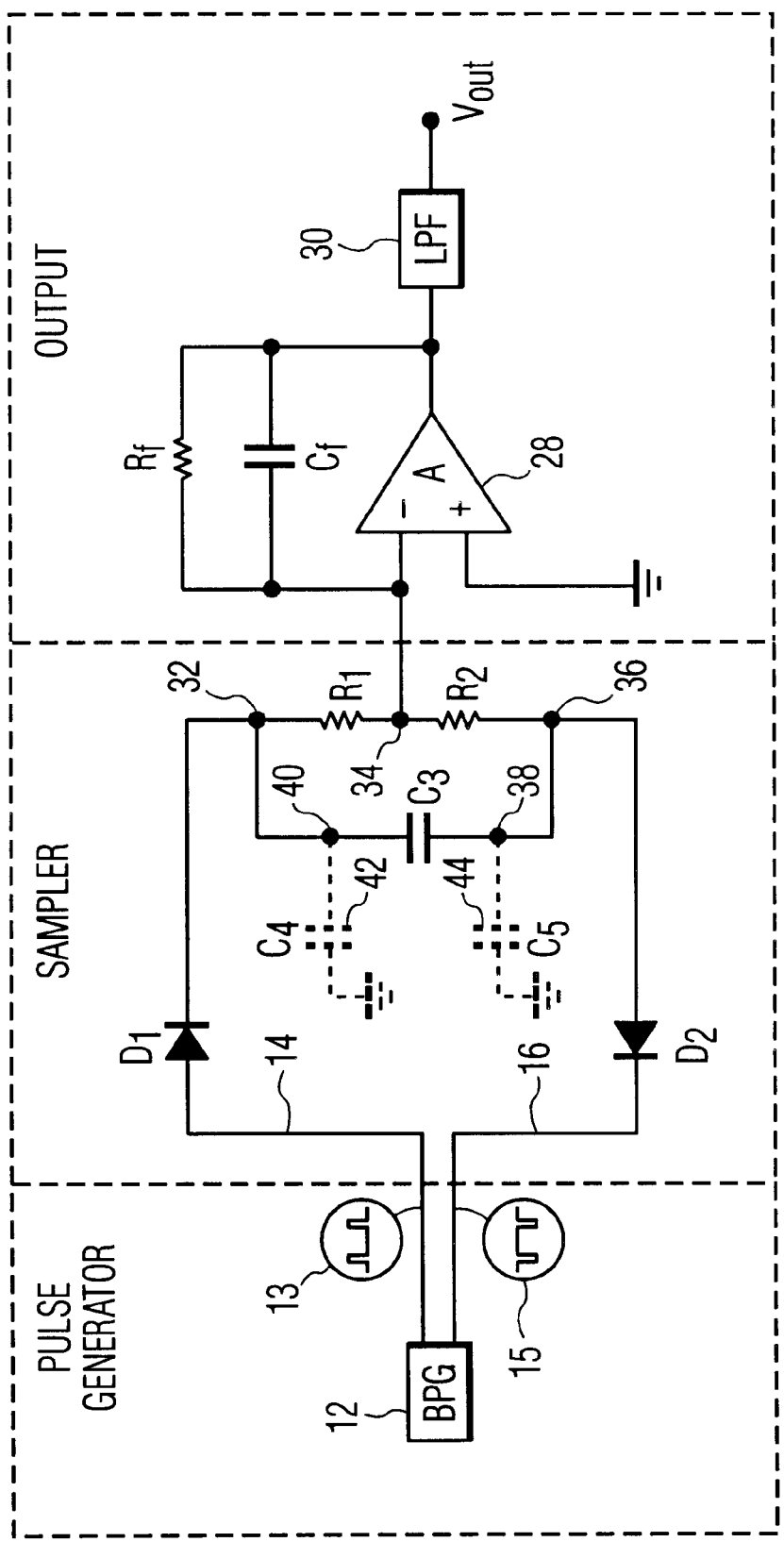
FIG. 1b is a schematic drawing of a differential capacitance sampler operating as a differential proximity sensor.

FIG. 1b shows an embodiment 40 suitable for proximity sensing in the current mode. In this embodiment, conductor 14 connects the positive pulse train output signal of pulse generator 12 to the anode of a first diode $D_1$, the cathode of $D_1$ being connected to node 32. Similarly, conductor 16 connects the negative pulse train output signal from pulse generator 12 to the cathode of a second diode $D_2$, the anode of $D_2$ being connected to node 36. The pulses are applied to an RC network formed among five nodes 32, 34, 36, 38 and 40. A capacitor $C_3$ is connected between nodes 38 and 40. A plate 42 connected to node 40 forms a capacitor $C_4$ with plate 42 as its first electrode and its local environment as its second electrode (shown in phantom). An optional plate 44 (shown in phantom) connected to node 38 forms a capacitor $C_5$ with plate 44 as its first electrode and the local environment as its second electrode (shown in phantom). In some implementations, plates 42 and 44 can be the electrodes of capacitor $C_3$ so that capacitor $C_3$ can be conveniently realized with a double-sided printed circuit board construction. Also, capacitor $C_3$ provides reserve charge for counteracting circuit leakage, particularly when the magnitude of the capacitances $C_4$ and $C_5$ is small, as is the case in proximity sensing. A first resistor $R_1$ is connected between nodes 32 and 34. A second resistor $R_2$ is connected between nodes 34 and 36. Node 34 is connected to the negative input terminal of a current mode amplifier (A) 28.

In operation, the circuit measures differential capacitance change in the capacitors $C_4$ and $C_5$ when an object intrudes into the emitted electrical field as in a double plate proximity sensor. A single plate proximity sensor is realized by omitting one of the plates 42 or 44. If $R_1$ and $R_2$ are selected to be equal in value, the output signal $V_{out}$ for the double plate embodiment is given substantially by equation (2):

$$V_{out}=(V-V_d)(C_4-C_5)R_f f \qquad (2)$$

where f is the frequency of the pulse generator.

Unlike the continuous wave emissions of proximity sensors in the prior art, this circuit emits only short duration charging pulses. As the environmental capacitance is determined from the acquired charge from the charging pulse, the environmental capacitance is, for all practical purposes, sampled during the duration of the charging pulse. Consequently, several proximity sensors may be operated adjacent to each other, provided that each samples the environment at an instant when the others are not sampling. By operating the samplers with the same pulse repetition frequency but with phasing of the charging pulse unique to each sampler, this circuit may be useful for applications such as capacitive tomography and three dimensional position sensing.

Further, this circuit is adaptable to sensors for characterization of materials based on changes in dielectric property due to changes in frequency or pulse width. To those familiar with the art, it is readily apparent that, with analog or digital control, this circuit can be adapted to scan materials for a characteristic signature based on detected capacitance as a function of pulse width. Such a characteristic signature may be useful, for example, in judging the ripeness or fruit or in identifying a particular material type.

Figure 1C:
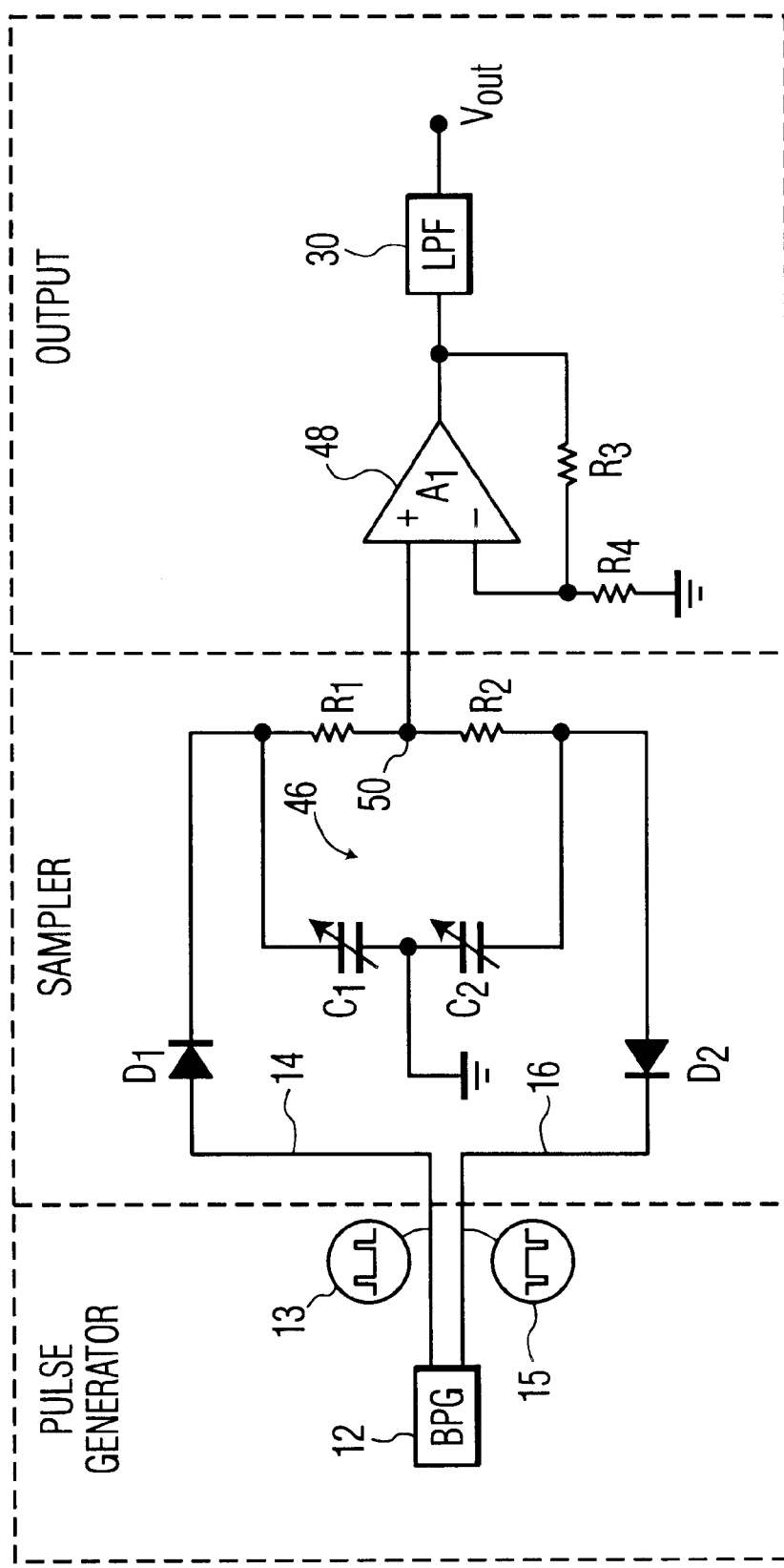
FIG. 1c is a schematic drawing of a differential capacitance sampler operating in a voltage mode.

FIG. 1c shows a voltage mode differential configuration for the capacitance sensor. In FIG. 1c, the amplifier (A1) 48 is configured with its positive input terminal connected to node 50 of a differential capacitance sampling bridge 46. The output terminal of amplifier (A1) 48 is connected to the negative input terminal of the amplifier through a resistor $R_3$. The negative input terminal of amplifier (A1) 48 is also connected to ground reference through a resistor $R_4$, the values of resistors $R_4$ and $R_3$ are selected to obtain a desired voltage gain G given by the equation $G=1+R_3/R_4$. The amplifier output signal is given substantially by equation (3):

$$V_{out}=G(V-V_d)(C_1-C_2)/(C_1+C_2) \qquad (3)$$

This equation is valid provided that the reverse bias capacitance of both diodes $D_1$ and $D_2$, and any stray capacitance shunting $C_1$ or $C_2$, is much smaller than the magnitude of $C_1$ and $C_2$. This embodiment allows the central plate of a three-plate capacitor to be grounded, while providing an output signal that is linearly related to the displacement of the central plate.

Figure 1D:
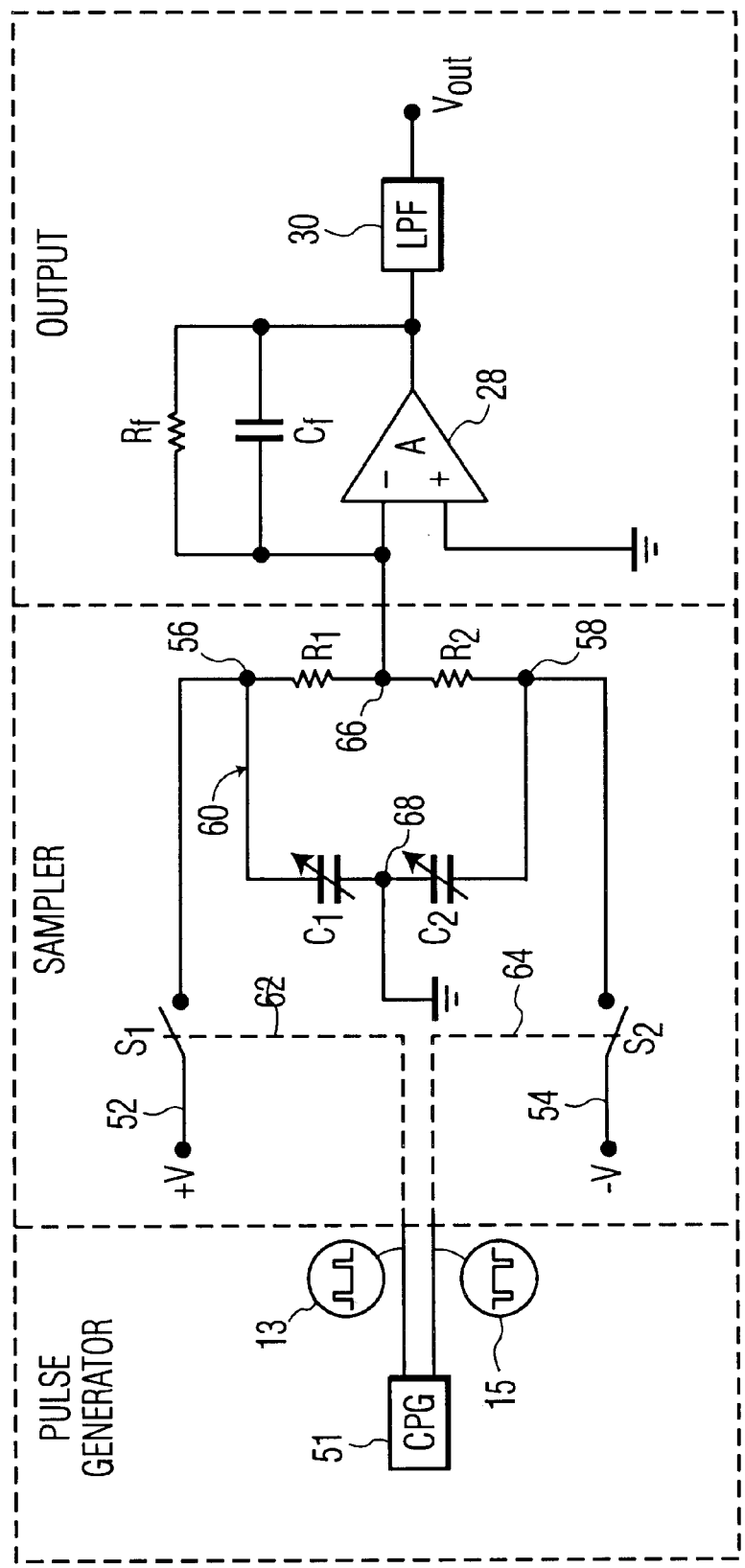
FIG. 1d is a schematic drawing of a differential capacitance sampler operating with switched charging sources.

FIG. 1d depicts an alternate embodiment of the capacitive sensing device operating in the current mode. In this embodiment, a conductor 52 connects a first DC source providing a voltage V to one terminal of a first analog switch $S_1$. The other terminal of $S_1$ is connected to node 56 of a differential capacitance sampling bridge 60. Conductor 54 connects a second DC source providing a negative voltage −V to one terminal of a second analog switch $S_2$. The other terminal of $S_2$ is connected to node 58 of bridge 60. A complementary pulse generator 51 provides switching waveforms as shown on control lines 62 and 64 for operating the switches. Switches $S_1$ and $S_2$ are selected from the same family of a manufacturer's offering, such that one switch is normally open, and the other, normally closed. In addition, the switches are selected to have the gate capacitances that are as nearly equal as possible to balance the effects of charge injection during switching. In FIG. 1d, analog switch $S_1$ is selected to be normally open and analog switch $S_2$, normally closed. If charge injection is small enough, as is likely to be the case with future generation of analog switches, both analog switches $S_1$ and $S_2$ can be selected to be of the same type, either normally-on, or normally-off. A low duty cycle, square wave oscillator providing an output signal with appropriate polarity such that the capacitors are charged during the short charging period can be used to control the switches.

In operation, when the switching waveform on control line 62 is high during a short period of the pulse repetition interval, the waveform on control line 64 is low, resulting in closure of analog switches $S_1$ and $S_2$. Current flows through the two resistors $R_1$ and $R_2$ and capacitors $C_1$ and $C_2$ whereby the two capacitors are fully charged to voltages V and −V. When the switching waveforms reverse, analog switches $S_1$ and $S_2$ open and capacitors $C_1$ and $C_2$ discharge through resistors $R_1$ and $R_2$ toward ground reference. If $R_1$ and $R_2$ are selected to be equal in value, amplifier (A) 28, configured in a current mode, provides an output signal $V_{out}$ given substantially by the equation (4):

$$V_{out}=V(C_1-C_2)R_f f \qquad (4)$$

This embodiment has the advantage over the embodiment shown in FIG. 1b of not offsetting the voltage V by the forward-bias diode voltage drop $V_d$.

Although specific methods have been detailed herein for crafting the various circuits, there are alternative means for implementing them. For example, switching diodes and analog switches are used in the circuits described above to implement a switching function. It is contemplated, however, that other devices such as metal oxide semiconductor field effect transistors (MOSFETs) can also be used to implement the switching function. Thus, it should be appreciated that implementing the circuit in such other forms would still be well within the scope of the invention.

The forgoing embodiments of the invention can be used in a variety of applications. Two exemplary applications are described in the following:

EXAMPLE 1

Low Cost Proximity Sensor

Figure 2:
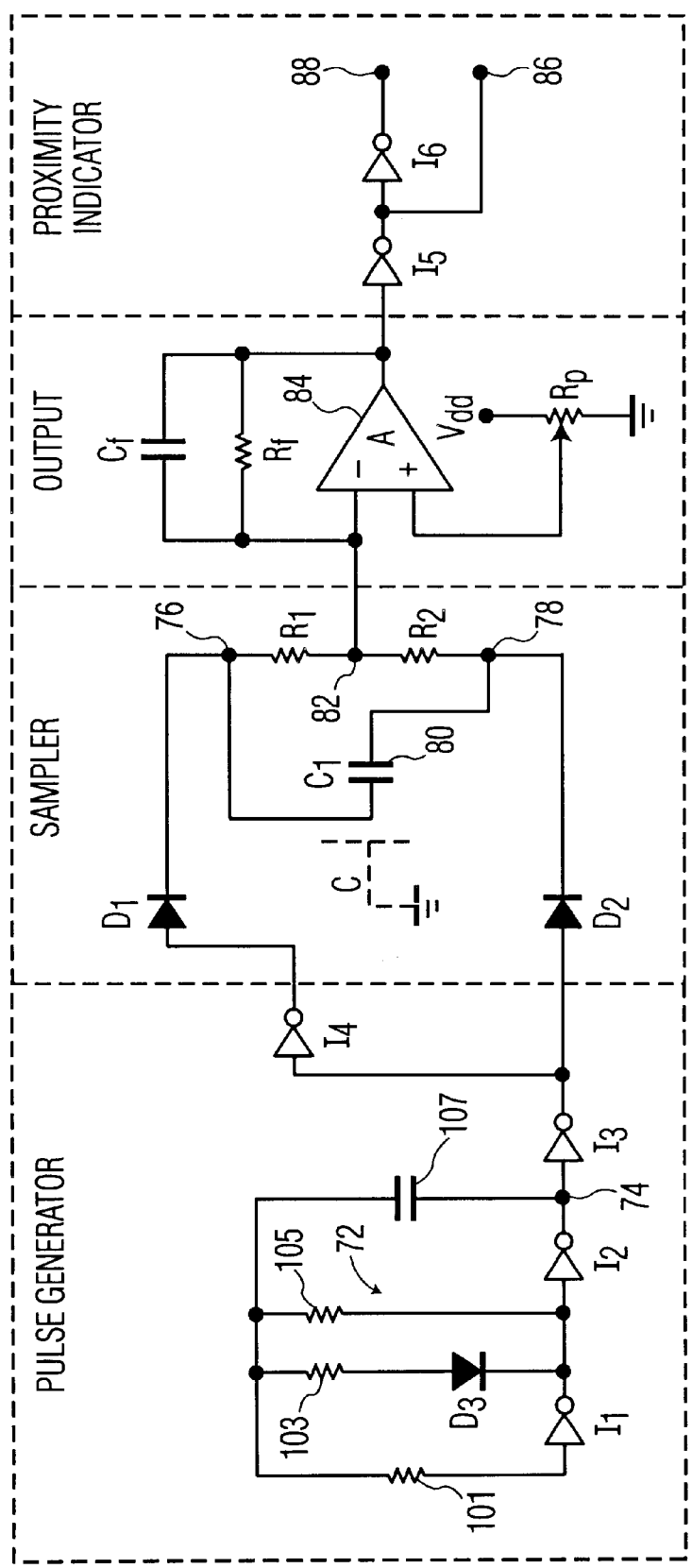
FIG. 2 is a schematic drawing of a low-cost proximity sensor.

FIG. 2 depicts a general schematic of a circuit that employs an embodiment of the present invention and that is suitable for use as a low cost, proximity detector. A pulse generator includes a conventional low duty cycle oscillator 72 formed by CMOS inverters $I_1$ and $I_2$ providing a positive pulse output signal at node 74. Inverter $I_3$, with its input terminal connected to node 74 buffers the oscillator and provides a complementary negative pulse output signal. Inverter $I_4$, with its input terminal connected to the output terminal of inverter $I_3$ provides a positive pulse output signal. (For high impedance loads, as is the case with capacitor bridges, CMOS inverters provide output signals that are accurately pulled to the power supply rails.) The output terminal of inverter $I_4$ is connected to the anode of a diode $D_1$. The cathode of diode $D_1$ is connected to node 76. The negative pulse train provided by the output terminal of inverter $I_3$ is connected to the cathode of a diode $D_2$. The anode of diode $D_2$ is connected to node 78. A capacitor $C_1$, coupled in parallel with two series resistors $R_1$ and $R_2$, is connected to nodes 76 and 78. Resistors $R_1$ and $R_2$ are connected serially to node 82, which in turn is connected to the negative input terminal of amplifier (A2) 84. The positive input terminal of the amplifier (A2) 84 is connected to the wiper of a potentiometer $R_p$, one terminal of which is connected to the positive power supply and the other to ground. The output terminal of the amplifier (A2) 84 is connected to its negative input terminal through a parallel combination of a resistor $R_f$ and a capacitor $C_f$, and to the input terminal of an inverter $I_5$. The output terminal of inverter $I_5$ is connected to the input terminal of an inverter $I_6$. The complementary output signals of the proximity detector are provided at terminals 86 and 88.

In operation, electrode 80 of capacitor $C_1$, together with a virtual electrode comprising its local environment, effectively forms a capacitor C (shown in phantom). The capacitance of C is a function of the near proximity of objects. As an object approaches electrode 80, the capacitance of C increases. As a result C stores additional charge during the short period of the pulse repetition cycle when the charging pulse is applied. During the longer discharge period, this charge appears at node 82 as an increased voltage, resulting in a decreased output signal from amplifier (A2) 84, that drains the additional charge through the resistor $R_f$. The capacitor $C_f$ enables filtering of the high frequency artifacts from the excitation. The output signals of $I_5$ and $I_6$, at nodes 86 and 88, respectively, provide "normally-off" and "normally-on" indications. The potentiometer $R_p$ is used to set the threshold for triggering the indication. When an object gets close to plate 80, the capacitance of capacitor C increases and the output signal of amplifier (A2) 84 decreases. When this voltage falls below the set threshold, voltage at node 86 transitions from ground potential to the potential of the positive power supply rail while the potential at node 88 exhibits a transition in the opposite direction.

Suitable components for this application are shown in Table 1

TABLE 1

| | |
|---|---|
| Inverters $I_1, I_2, I_3, I_4, I_5$ and $I_6$ | 74C04 Hex Inverter |
| Amplifier 84 | TLC2201 |
| Diodes $D_1, D_2$ and $D_3$ | 1N914 |
| Resistors R1 and R2 | 10 kΩ |
| Resistor $R_f$ | 10 mΩ |
| Resistor 101 | 470 kΩ |
| Resistor 103 | 560 Ω |
| Resistor 105 | 100 kΩ |
| Variable Resistor Rp | 47 kΩ, linear taper |
| Capacitor 107 | 33 pF |
| Capacitor Cf | 470 pF |
| Capacitor $C_1$ | 1.5 inch square doubled-sided circuit board of 0.063 inch thickness having a capacitance of 42 pF |

The exemplary circuit operates with a single supply at 5V, excitation at 150 KHz and 10% duty cycle, and detects proximity of a finger to electrode 80 at approximately 3 cm (1.25 inches).

EXAMPLE 2

Differential Capacitance Sensor for Transducers

Figure 3:
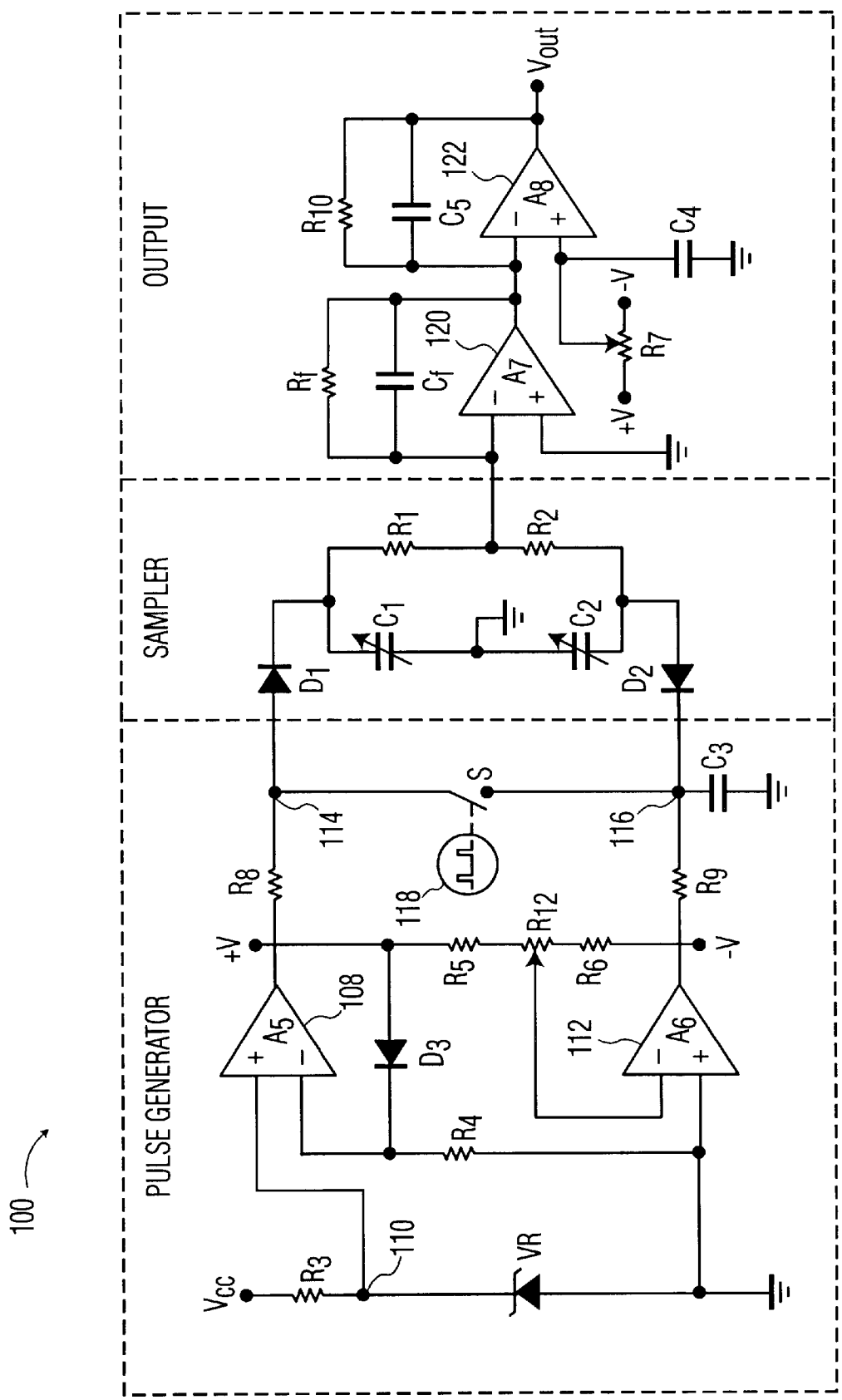
FIG. 3 is a schematic drawing of a differential capacitance sensor suitable for transducers.

FIG. 3 depicts a general schematic of a differential capacitance measuring circuit for transducers that desirably have high sensitivity, low noise and high accuracy. It includes a pulse generator for providing temporally synchronous complementary pulses with little or no latency between the pulses, and compensation for variation in the forward-biased diode voltage drop that may occur with changes in temperature.

A differential capacitance measuring circuit 100 includes a pulse generator, a capacitance sampler and an output device that provides an output signal. The pulse generator includes an amplifier (A5) 108 with its positive input terminal connected to node 110 that joins a first terminal of resistor $R_3$ and a first terminal of a voltage reference (e.g. a zener diode VR). The second terminal of resistor $R_3$ is connected to a positive DC power supply and the second terminal of the voltage reference VR is connected to a source of reference potential (e.g. ground). The output terminal of amplifier (A5) 108 is connected to the anode of a diode $D_3$, the cathode of which is connected to the negative input terminal of amplifier (A5) 108. The negative input terminal of amplifier (A5) 108 is also connected to a first terminal of a resistor $R_4$, the second terminal of which is connected to ground. A first terminal of a resistor $R_5$ is connected to the anode of diode $D_3$ and its second terminal is connected to one of the fixed terminals of a potentiometer $R_{12}$ The wiper terminal of the potentiometer is connected to the negative input terminal of amplifier (A6) 112. The other fixed terminal of the potentiometer $R_{12}$ is connected to a first terminal of resistor $R_6$, and the second terminal of $R_6$ is connected to the output terminal of the amplifier (A6) 112. The positive input terminal of amplifier (A6) 112 is connected to ground reference. A first terminal of a resistor $R_8$ is connected to the output terminal of amplifier (A5) 108, and the second terminal of resistor $R_8$ is connected to node 114. A first terminal of a resistor $R_9$ is connected to the output terminal of amplifier (A6) 112, the second terminal of the resistor being connected to node 116. In this configuration, respective regulated positive and negative voltages, +V and −V are provided at the output terminals of amplifiers (A5) 108 and (A6) 112. A first terminal of an analog switch S is connected to node 114 and its second terminal is connected to node 116. A first terminal of a capacitor $C_3$ is connected to node 116 and its second terminal is connected to ground reference.

Analog switch S is controlled by a conventional, low duty cycle, square wave oscillator 118, which may be crystal controlled. Nodes 114 and 116, respectively, are the output terminals of the pulse generator supplying low duty cycle, balanced positive and negative charging pulses to the capacitance sampler. The output signal of amplifier (A7) 120 is further amplified by amplifier (A8) 122, configured in a voltage mode. The two fixed terminals of potentiometer $R_7$ are connected to the regulated positive and negative voltages +V and −V, the wiper terminal of the potentiometer is connected to the positive input terminal of amplifier (A8) 122. A capacitor $C_4$ with a first terminal connected to the wiper of potentiometer $R_7$ and its second terminal connected to ground stabilizes the voltage presented to the positive input terminal of amplifier (A8) 122. Setting of this potentiometer enables the user to null any offset on the input signals applied to amplifier A8 that may arise from component imbalances.

In operation, amplifier (A5) 108 provides a regulated DC voltage that is compensated for variations in the voltage drop of the forward-bias diodes $D_1$ and $D_2$ which has a negative temperature coefficient. The output signal of amplifier (A5) 108 is the reference voltage of VR plus the forward-biased voltage drop of diode $D_3$. Amplifier (A6) 112, which is wired as a unity gain inverter, produces an output signal that is equal in magnitude but opposite in sign to that of amplifier (A5) 108. The potentiometer $R_{12}$ allows the user to null any offset on the input signals to amplifier (A6) 112 that may result from component imbalances. A dual operational amplifier package such as LF 353 is suitable for use as amplifier (A5) 108 and (A6) 112. Diode $D_3$ is selected to be of the same type as diodes $D_1$ and $D_2$. Therefore, if for example, the temperature increases then the output signals of amplifier (A5) 108 and amplifier (A6) 112 decrease. At the same time, the forward voltage drop of diodes $D_1$ and $D_2$ also decreases by the same amount. Consequently, the magnitude of the positive and negative voltage presented to capacitors $C_1$ and $C_2$ during the charging period remains substantially constant in spite of temperature variations.

The analog switch S may be either of the normally-open or normally-closed type, provided that the control wave form is such as to keep it open during the relatively short charging period and closed during the ensuing relatively long discharge period. For example, a MAX317 device, a normally-on switch, is suitable when used with a low duty cycle waveform in which the control voltage is high during the short charging period. The amplitude of the control voltage from the low duty cycle oscillator 118 is desirably the minimum necessary for actuating analog switch S so that charge injection, and thus, the transition from an on state to an off state, is as small as possible. The voltage pulse due to charge injection during switch closure of analog switch MAX317 is further attenuated by capacitor $C_3$ connected between node 116 and ground so that capacitors $C_1$ and $C_2$ are charged to voltages equal in magnitude, but opposite in polarity. For other switches, $C_3$ may be connected between node 114 and ground.

Suitable component values for the exemplary application shown in FIG. 3 are given in Table 2.

TABLE 2

| Amplifier 108 and 112 | LF353 |
|---|---|
| Amplifier 120 and 122 | TLC2272 |
| Diodes $D_1$, $D_2$ and $D_3$ | BAS16 |
| Voltage Reference VR | ZRC330 |
| Resistors R1, R2, R4 and R10 | 22 kΩ |
| Resistor R3 | 10 kΩ |
| Resistors R5, R6 and R11 | 1 kΩ |
| Resistors R8 and R9 | 2 kΩ |
| Potentiometers R7 and R12 | 47 kΩ, linear taper |
| Resistor Rf | 470 kΩ |
| Capacitors C1 and C2 | 16 pF |
| Capacitor C3 | 18 pF |
| Capacitors C4 and Cf | 1 nF |
| Capacitor C5 | 0.01 μF |

Accordingly, from the various embodiments described in the forgoing, it is manifestly evident that the invention provides a new differential capacitance sampler that is highly sensitive, economical to implement and adaptable to differing needs. More specifically, it provides a capacitance sampler with sensitivity that is directly proportional to sampling frequency and to differential capacitance, regardless of the size of each capacitance. This capacitor has improved noise performance when compared to prior art capacitance sensors. Also, it allows the central plate of a three plate differential capacitor to be grounded. Moreover, it is suitable for proximity sensing in the presence of moisture and other ionic conductors because of its short charging pulse, which can be made to be less than 100 ns in duration. It also functions equally well as a differential proximity sensor.

Many alterations and modifications may be made by those having ordinary skill in the art without departing from the spirit and scope of the invention. Therefore, it must be understood that the illustrated embodiments have been set forth only for the purposes of example and that they should not be taken as limiting the invention as defined by the following claims.

What is claimed:

1. A differential capacitance sampler, comprising:
a balanced pulse generator which concurrently produces first and second complementary charging pulses at respective first and second terminals, wherein the first charging pulse is a positive-going pulse and the second charging pulse is a negative-going pulse;
a bridge circuit having a first branch and a second branch connected between a first node coupled to the first terminal of the balanced pulse generator and a second node coupled to the second terminal of the balanced pulse generator, and including a differential capacitance, the bridge circuit producing an output signal in response to the charging pulses of the pulse generator, which output signal changes in value due to changes in the differential capacitance; and a signal processor which processes the output signal of the bridge circuit to provide an output signal of the differential capacitance sampler.

2. A sampler according to claim 1 wherein the duty cycle of the pulse generator is less than 50%.

3. A sampler according to claim 2 wherein:
the first branch comprises first and second resistors connected in series at a third node, the second branch comprises at least one capacitor which forms the differential capacitance; and
the signal processor is an amplifier connected to amplify signals at the third node of the bridge circuit.

4. A sampler according to claim 3 wherein the second branch of the bridge circuit comprises first and second capacitors connected in series at a fourth node that is connected to a source of reference potential.

5. A sampler according to claim 4 further including a third capacitor connected in parallel with the serially connected first and second capacitors.

6. A sampler according to claim 3 wherein the second branch of the bridge circuit comprises a single capacitor having first and second plates connected between the first node and the second node, wherein an environment surrounding the single capacitor forms a further capacitor with at least one of the first and second plates.

7. A sampler according to claim 3 additionally comprising:
a first diode having an anode and a cathode, the anode of the first diode being connected to the first terminal of the pulse generator and the cathode of the first diode being connected to the first node; and
a second diode having an anode and a cathode, the cathode of the second diode being connected to the second terminal of the pulse generator and the anode of the second diode being connected to the second node.

8. A sampler according to claim 3 further including:
a first direct current (DC) voltage source having a first polarity;
a second DC voltage source having a second polarity opposite to the first polarity;
a first analog switch coupled between the first DC voltage source and the first node, the first analog switch having a control terminal coupled to receive the charging pulses provided by the pulse generator, the charging pulses causing the first analog switch to close during a sampling period; and
a second analog switch coupled between the second DC voltage source and the second node, the second switch having a control terminal coupled to receive the charging pulses provided by the pulse generator, the charging pulses causing the second analog switch to close during the sampling period.

9. A sampler according to claim 2 wherein the pulse generator comprises a square wave oscillator which provides a square-wave output signal, and the sampler further comprises:
a first logic inverter circuit, coupled to receive the square-wave output signal, to provide an output signal that is a logic-inverse of the square-wave output signal; and
a second logic inverter circuit, coupled to receive the output signal of the first logic inverter circuit, to provide an output signal that is a logic-inverse of the output signal of the first logic inverter circuit;
wherein, the output signals of the first and second logic inverter circuits are pulse trains having amplitudes that are approximately equal in magnitude and approximately 180° out of phase.

10. A sampler according to claim 2 wherein:
the pulse generator comprises a square wave oscillator which provides a square-wave output signal, and the sampler further comprises:

a first direct current (DC) voltage source which provides an output signal having a magnitude and polarity;

a second DC voltage source which provides an output signal having a magnitude approximately equal to the magnitude of the output signal of the first DC voltage source and a polarity that is approximately opposite to the polarity of the output signal of the first DC voltage source;

a first resistor having first a nd second terminal s, the first terminal of the first resistor being connected to the first DC voltage source;

a second resistor having first and second terminals, the first terminal of the second resistor being connected to the second DC voltage source; and an analog switch having a first terminal connected to the second terminal of the first resistor, a second terminal coupled to the second terminal of the second resistor, and a control terminal coupled to the pulse generator;

whereby output signals provided at the first and second terminals of the analog switch provide respective pulse trains that are approximately equal in magnitude and approximately opposite in phase.

11. A method for sampling a difference in capacitance between at least two capacitors comprising the steps of:

charging each of the at least two capacitors of a bridge circuit, during a sampling period, to respective voltages that are substantially equal in magnitude but substantially opposite in polarity;

allowing the at least two capacitors to discharge during a discharge period which follows the sampling period to produce respective discharge voltage signals;

measuring a sum of the discharge voltage signals during the discharge period to provide a measure of the difference in capacitance between the at least two capacitors.

12. A method according to claim 11 wherein the step of charging each of the at least two capacitors includes the step of applying a charging pulse having a duty cycle of less than 50% to the at least two capacitors.

13. A method according to claim 11 wherein the step of measuring the sum of the discharge voltages comprises the steps of:

combining the discharge voltage signals to form a summed discharge voltage signal;

amplifying the summed discharge voltage signal; and integrating the amplified summed discharge voltage signal to provide the measure of the difference in capacitance between the at least two capacitors.

14. A method according to claim 13 wherein one of the at least two capacitors is an environmental capacitance formed with one capacitor of the at least two capacitors and the step of charging each of the at least two capacitors includes the step of charging the one capacitor to charge both the one capacitor and the environmental capacitance.

15. A differential capacitance sampling array, comprising:

a plurality of differential capacitance samplers, each sampler including:

a balanced pulse generator which concurrently produces first and second complementary charging pulses at respective first and second terminals, wherein the first charging pulse is a positive-going pulse and the second charging pulse is a negative-going pulse;

a bridge circuit having a first branch and a second branch connected between a first node coupled to the first terminal of the balanced pulse generator and a second node coupled to the second terminal of the balanced pulse generator, and including a differential capacitance, the bridge circuit producing an output signal in response to the charging pulses of the pulse generator, which output signal changes in value due to changes in the differential capacitance; and a signal processor which processes the output signal of the bridge circuit to provide an output signal of the differential capacitance sampler;

wherein the periodic charging pulses produced by the balanced pulse generators of the plurality of differential capacitance samplers have identical frequencies but respectively different phases.

* * * * *